US010141497B2

(12) United States Patent
Abbott, Jr. et al.

(10) Patent No.: US 10,141,497 B2
(45) Date of Patent: Nov. 27, 2018

(54) THIN FILM STACK

(75) Inventors: James Elmer Abbott, Jr., Corvallis, OR (US); Peter Mardilovich, Corvallis, OR (US); Stephen F. Bylund, Corvallis, OR (US); Christopher Shelton, Raleigh, NC (US)

(73) Assignee: HEWLETT-PACKARD DEVELOPMENT COMPANY, L.P., Houston, TX (US)

(*) Notice: Subject to any disclaimer, the term of this patent is extended or adjusted under 35 U.S.C. 154(b) by 282 days.

(21) Appl. No.: 14/418,003

(22) PCT Filed: Jul. 31, 2012

(86) PCT No.: PCT/US2012/048992
§ 371 (c)(1),
(2), (4) Date: Jan. 28, 2015

(87) PCT Pub. No.: WO2014/021850
PCT Pub. Date: Feb. 6, 2014

(65) Prior Publication Data
US 2015/0228886 A1    Aug. 13, 2015

(51) Int. Cl.
*H01L 41/08* (2006.01)
*B41J 2/14* (2006.01)
*H01L 41/09* (2006.01)
*H01L 41/319* (2013.01)

(52) U.S. Cl.
CPC ...... *H01L 41/0815* (2013.01); *B41J 2/14233* (2013.01); *H01L 41/0973* (2013.01); *H01L 41/319* (2013.01); *B41J 2202/03* (2013.01); *Y10T 428/265* (2015.01)

(58) Field of Classification Search
CPC .................................................... B41J 2/01
See application file for complete search history.

(56) References Cited

U.S. PATENT DOCUMENTS

| 6,169,246 B1 | 1/2001 | Wu et al. |
| 6,341,850 B1 * | 1/2002 | Sakai ............... B41J 2/14233 347/70 |
| 6,398,349 B1 * | 6/2002 | Murai ................... B41J 2/161 347/68 |
| 8,023,309 B2 | 9/2011 | Tanaka et al. |
| 8,035,281 B2 | 10/2011 | Shibata et al. |

(Continued)

FOREIGN PATENT DOCUMENTS

| GB | 852675 | 10/1960 |
| JP | 11111466 | 4/1999 |

(Continued)

OTHER PUBLICATIONS

International Search Report and Written Opinion dated Mar. 29, 2013 for International Application No. PCT/US2012/048992 filed Jul. 31, 2012, Applicant Hewlett-Packard Development Company, L.P. et al.

(Continued)

*Primary Examiner* — Geoffrey Mruk
(74) *Attorney, Agent, or Firm* — HP Inc.—Patent Department

(57) ABSTRACT

The present disclosure is drawn to a thin film stack including a substrate, a metal layer, and an adhesive layer. The adhesive layer comprises a blend of zinc oxide and tin oxide, and the adhesive layer is adhered between the substrate and the metal layer.

27 Claims, 2 Drawing Sheets

(56) References Cited

U.S. PATENT DOCUMENTS

| | | | |
|---|---|---|---|
| 2003/0063249 A1* | 4/2003 | Hoshino | G02F 1/13458 |
| | | | 349/149 |
| 2006/0055745 A1* | 3/2006 | Yagi | B41J 2/14233 |
| | | | 347/71 |
| 2006/0187272 A1 | 8/2006 | Torii et al. | |
| 2009/0051278 A1 | 2/2009 | Saneto et al. | |
| 2009/0075421 A1 | 3/2009 | Chen et al. | |
| 2010/0123368 A1 | 5/2010 | Fujii et al. | |
| 2010/0213795 A1 | 8/2010 | Li et al. | |
| 2011/0210362 A1 | 9/2011 | Lee et al. | |
| 2011/0272691 A1 | 11/2011 | Kuegler et al. | |

FOREIGN PATENT DOCUMENTS

| | | | | |
|---|---|---|---|---|
| JP | 2010-44300 | * | 2/2010 | G09F 9/30 |
| KR | 20110041270 | | 4/2001 | |

OTHER PUBLICATIONS

Stambolova, Spray Pyrolysis Preparation and Humidity Sensing Characteristics of Spinel Zinc Stannate Thin Films, Journal of Solid State Chemistry 128, Article No. SC967174, pp. 305-309, 1997.
Supplementary European Search Report dated Jan. 28, 2016 for PCT/US2012048992, Applicant Hewlett-Packard Development Company, L.P.

* cited by examiner

THIN FILM STACK

BACKGROUND

Adhesion between various materials in thin film stacks, including the adherence of metals to non-metal films, present challenges, particularly in environments where high temperatures, piezoelectric vibration, and certain migrating elements or compounds may be present in nearby layers. The piezoelectric printhead is an example of such a device that can be prepared or used under some of these conditions. In piezoelectric printheads, for example, various layers of metal and non-metal films are stacked and adhered together; and high temperatures, piezoelectric actuation, and migration of lead or other materials can be common from layer to layer. For example, in systems that use titanium oxide to bond various layers together, lead containing layers that may be present, such as lead zirconate titanate (PZT), provide a source for lead ion migration through metal electrodes into the titanium oxide, which can undermine the function of the device over time. Furthermore, titanium oxide and other adhesive layers tend to underperform when exposed to very high manufacturing temperatures. Thus, it would be desirable to provide improved adhesives for use in such thin film stacks and other related thin material systems.

DETAILED DESCRIPTION

Figure 1:
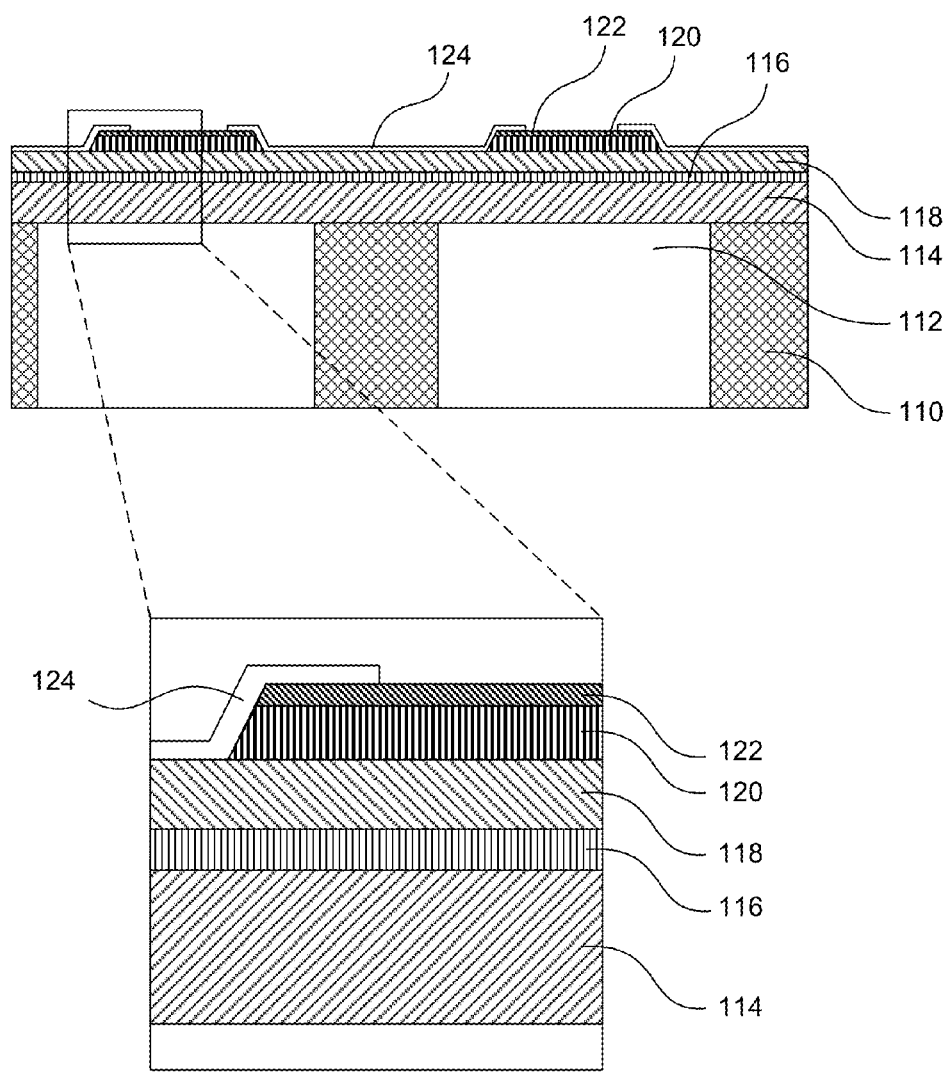
FIG. 1 is a schematic representation of a portion of inkjet printhead, including a thin film stack, prepared in accordance with examples of the present disclosure.

Piezoelectric devices, such as piezoelectric inkjet printheads or sensors, can be prepared by stacking various piezoelectric materials, other films, and metal, e.g., conductors and/or electrodes, in specific configurations for piezoelectric actuation or piezoelectric sensing. In the case of a piezoelectric printhead, piezoelectric actuation on or in an ink chamber can be used to eject or jet fluids therefrom. One such piezoelectric material is lead zirconate titanate or PZT, which can be grown or otherwise applied on the surface of a metal electrode, such as platinum, ruthenium, palladium, and iridium, as well as some conductive and non-conductive oxides, such as $IrO_2$, $SrRuO_3$, $ZrO_2$, etc. The appropriate adhesion of the metal electrode (which upon completion, can have PZT or another piezoelectric material applied to one side thereof) to an underlying layer can be provided by an adhesion layer including a blend of zinc oxide and tin oxide. The adhesion of many noble metal electrodes and other metals (e.g., copper) that do not adhere well to other materials, such as especially non-metallic surfaces, oxide surfaces, or polymers, may not typically strong enough without the presence of an adhesive layer. Furthermore, even if adhesion is acceptable by using other types of adhesive materials, there can be other drawbacks with some of these other known adhesive materials that are used in thin film stacks, as will be discussed to some degree hereinafter.

In accordance with this, the present disclosure is directed generally towards a thin film stack, which includes a substrate, a metal layer, an adhesive layer positioned and providing adherence between the substrate and the metal layer. The thin film stack can also include a piezoelectric layer attached thereto, either directly or indirectly through one or more intermediate layer(s). It is noted that the "thin film stack" can also be defined to include the piezoelectric layer. Additionally, other electrodes or layers may also be included as part of the thin film stack. Thus, in describing the thin film stack to include the substrate, the metal layer, and the adhesive, these layers are merely set forth to state that the thin film stack includes at least these layers, and other layers can also become part of the thin film stack, such as the piezoelectric layer, electrodes, insulating layers, semi-conducting layers, etc. Typically, the piezoelectric material can be applied directly to the metal layer, particularly when the metal layer is a metal electrode. Thus, in one example, the metal layer is an electrode, and in another example, the metal layer is a conductive layer. In further detail, particularly in the case of piezoelectric devices, a piezoelectric material can be applied to the metal layer. In accordance with this, the adhesive layer includes a blend of zinc oxide and tin oxide, which provides many benefits over other adhesives typically used in the art.

In another example, a method of preparing a piezoelectric thin film stack can comprise adhering a first side of a metal layer to a substrate using an adhesive blend of zinc oxide and tin oxide, and forming a piezoelectric material on a second side of the metal layer.

In each of the various embodiments described herein, whether discussing the thin film stack device or related methods, there may be some common features of each of these embodiments that further characterize options in accordance with principles discussed herein. Thus, any discussion of the thin film stack or method, either alone or in combination, is also applicable to the other embodiments not specifically mentioned. For example, a discussion of the adhesive layer in the context of the thin film stack is also applicable to the related method, and vice versa.

It is noted that when referring to "tin oxide," this term can include any of various blends of oxidized tin, including blends of stannous oxide and stannic oxide, e.g., $SnO$, $SnO_2$, respectively. Furthermore, because there are multiple forms of tin oxide, when referring to the atomic % (at %) of the blends of zinc oxide and tin oxide (e.g., "$ZnSnO_3$" or "ZTO"), this percentage can be determined based on the total atomic percentage of each respective element, i.e. zinc, tin, and oxygen. For example, if a composition includes 100 at % ZTO (with essentially no dopant), then there could be about 20 at % zinc, about 20 at % tin, and about 60 at % oxygen. If there is dopant present (anything other than zinc, tin, and oxygen), then the percentages of each of these elements would decrease accordingly. On the other hand, when determining the relative atomic percentage of the zinc oxide and the tin oxide relative to one another, the metal oxide can form the basis of the atomic percentage (or molecular percentage of the oxide compound). Thus, in accordance with the present disclosure, atomic percentages can be calculated not only for individual elements, but also for metal oxides, taking into account both the metal content and the oxygen content. This can also be referred to as "molecular percent" but for consistency, atomic percent is used herein throughout and the context will determine whether the percentage is based on the individual element or on the small molecule.

It is further noted that when referring to "titanium oxide" for comparison purposes, it is understood that there are various forms of titanium oxides, including $TiO_2$, $Ti_2O_3$, TiO, etc., and thus, the general term "titanium oxide" is used to include adhesives or layers that generally include oxidized titanium.

Turning now to the FIGS., it is noted that the drawings herein are not to be considered as being to scale, and are thus, merely schematic to assist in showing and describing an embodiment of the present disclosure. Furthermore, though an inkjet printhead is shown in the FIGS. with various specific layers, it is understood that this is not intended to limit the scope of the present disclosure. This example is merely provided to show an example of the various thin film stacks that can be used in various devices, such as piezoelectric actuators or sensors.

FIG. 1 sets forth a schematic view of a portion of an inkjet printhead 100, with an expanded view of Section A provided for additional clarity. In this FIG, a silicon support is fabricated to include multiple ink chambers 112 for receiving and jetting ink there from. It is noted that often, ink chambers or other areas where ink may contact the printhead can be coated with any of a number of protective coatings. Those coatings are not shown in FIG. 1, but it is understood that such a coating may be used for protective purposes without departing from the scope of the present disclosure. For example, tantalum or tantalum oxide coatings, e.g., $Ta_2O_5$, are often used for this purpose. That being said, other support material(s) can be used alternatively or in addition to the exemplified silicon support and optional protective coatings. Thus, the term "support" typically includes structures comprising semi-conductive materials such as silicon wafer, either alone or in assemblies comprising other materials applied thereto. Metallic supports can also be used, including metallic materials with an insulating material applied thereto. Certain specific materials that can be used for the support material include silicon, glass, gallium arsenide, silicon on sapphire (SOS), epitaxial formations, germanium, germanium silicon, diamond, silicon on insulator (SOI) material, selective implantation of oxygen (SIMOX) substrates, or other similar materials. Furthermore, the substrate described herein can actually be the support material, particularly when the support material inherently includes an oxidized surface. However, in many typical examples, a separate membrane of oxidized material is applied to the support and acts as the substrate.

Turning now to the thin film stack 100 of this example, a substrate 114, an adhesive layer 116, a metal electrode 118, a piezoelectric layer 120, a second metal electrode 122, and a passivation layer 124 is shown. Other layers are also usable, including other insulating, semi-conducing, conducting, or protective layers that are not shown. However, one skilled in the art would recognize other layers that could optionally be used, or optionally omitted from the structure shown in FIG. 1.

In the system shown, the metal electrode 118 and the second metal electrode 122 are used to generate an electric field with respect to the piezoelectric layer 120, and as the piezoelectric layer is actuated, the thin film stack 100 vibrates into an appropriate ink chamber 112, causing inkjetting to occur. As each of these layers are shown in this example, each will be described hereinafter in additional detail, with emphasis placed on the adhesive layer and its interaction with the non-conductive or semi-conductive substrate and the metal layer that the adhesive layer contacts.

Turning to the specific layers, with specific reference to the substrate 114, this layer can be the support material with an oxide layer inherently present on its surface, but is typically prepared as an oxide membrane applied to the support material, e.g., $SiO_2$, $ZrO_2$, $HfO_2$, $Ta_2O_5$, $Al_2O_3$, $SrTiO_3$, etc. These membranes can be applied as multiple layers, and/or be prepared using multiple materials in a common layer. Thus, the materials are typically applied as one or more layer to the silicon or other support material as described above. When the substrate is in the form of a thin film or membrane, the substrate can be formed at a thickness from 10 Å to 10 μm, for example. In an example piezoelectric actuator device, the thickness of this substrate, e.g., oxidized membrane, can be approximately the same thickness as piezoelectric layer, e.g., at a 1:2 to 2:1 thickness ratio of substrate layer to piezoelectric layer, and both layers can be about 50 nm or greater.

In further detail with respect to the metal layers, which are metal electrodes 118, 122 in this example, these electrodes can be applied at a thickness from 5 nm to 5 microns, though thicknesses outside this range can also be used. Materials that can be used, particularly for electrodes, typically include noble metals or other metals or alloys, including but not limited to, platinum, copper, gold, ruthenium, iridium, silver, nickel molybdenum, rhodium, and palladium. In other examples, oxides of these or other metals can also be used, such as $IrO_2$ or $SrRuO_3$, if the adhesive properties of the adhesion layers of the present disclosure would be beneficial for use. Platinum is of particular interest as a metal that benefits from the adhesive layers of the present disclosure because its surface does not become readily oxidized. Metal electrodes (or metals applied for another purpose, such as for conductive layers or traces) can be deposited using any technique known in the art, such as sputtering, evaporation, growing the metal on a substrate, plasma deposition, electroplating, etc.

In piezoelectric systems in particular, the metal electrodes 118, 122 selected for use should be those which can effectively cause appropriate movement of the piezoelectric materials, such as those used in the piezoelectric layer 120. This is particularly true with respect to metal electrode 118, which is in direct contact with the adhesive layer 116. To illustrate, in one example, the piezoelectric layer can comprise lead zirconate titanate (PZT). As PZT contains lead, and lead cations are migratory though other metals under the proper conditions, there can be problems associated with lead migrating into and through the metal electrode, e.g., lead migrates fairly readily through platinum when a titanium oxide adhesive layer is applied to the opposite side of the metal electrode. This is believed to occur because after annealing platinum and titanium oxide during the manufacturing process, especially at high temperatures, lead cations will diffuse into or through the platinum and into the titanium oxide, forming lead titanate ($PbTiO_3$). Thus, in accordance with examples of the present disclosure, by using a blend of zinc oxide and tin oxide, decreased migration of lead cations through the metal electrode compared to similar systems utilizing titanium oxide adhesive can be achieved.

As alluded to, with respect to inkjet printheads or fluid ejection systems, the piezoelectric film or layer is typically disposed between electrodes 118, 122 and receives drop firing and non-firing signals from a controller acting on the electrodes. Thus, the electrodes are actively driven to actuate the piezoelectric layer, thereby causing ink to flow from the ink chamber 112 to a drop forming outlet or orifice (not shown). The inkjet ink is thus jetted toward a print medium or other transfer surface or device. During this firing process, piezoelectric actuators often can be fired up to 100 billion cycles, or even higher, which even at relatively low temperatures, e.g., less than 100° C., can lead to diffusion of lead cations over time into and through the metal electrodes.

Furthermore, and perhaps more significantly, during manufacture of certain piezoelectric devices, very high temperatures are often used, e.g., exceeding 500° C., 700° C., or even 1000° C. Thus, lead cation diffusion from a piezoelectric layer, such as PZT, into/through a metal electrode, such as platinum, can be relatively quick and problematic. As mentioned, this is particularly problematic when titanium oxide is used as the adhesive on the opposite side of the metal electrode as the PZT, and use of the adhesive blends of the present disclosure provide a solution to this problem.

A suitable material for the piezoelectric layer 120 that can be used includes, as mentioned, lead zirconium titanate (PZT). In general, with respect to PZT, the general formula can be $Pb(Zr_{1-x}Ti_x)O_3$, where x is from 0.1 to 0.9. However, it is notable that different dopants can be used, such as La, Nb, etc. Thus, other materials for the piezoelectric layer can also be used, including lead lanthanum zirconium titanate (PLZT, or La doped PZT), lead niobium zirconium titanate (PNZT, or Nb doped PZT), and PMN-PT $(Pb(Mg,Nb)O_3$—$PbTiO_3)$. Lead-free piezoelectric layers may also be used, examples of which include $LiNbO_3$, BCTZ $[Ba(Ti_{0.8}Zr_{0.2})O_3$—$(Ba_{0.7}Ca_{0.3})TiO_3]$, tungsten bronze structured ferroelectrics (TBSF), BNT-BT $[(Bi_{0.5}Na_{0.5})TiO_3$—$BaTiO_3]$, BT $[BaTiO_3]$, AlN, AlN doped with Sc, and ternary compositions in the BKT-BNT-BZT $[(Bi_{0.5}K_{0.5})TiO_3$—$(Bi_{0.5}Na_{0.5})TiO_3$—$Bi(Zn_{0.5}Ti_{0.5})O_3]$ system, a specific example of which includes $0.4(Bi_{0.5}K_{0.5})TiO_3$-$0.5(Bi_{0.5}Na_{0.5})TiO_3$-$0.1Bi(Zn_{0.5}Ti_{0.5})O_3)$. Other suitable piezoelectric materials can be used for the piezoelectric layer, or combinations of materials or multiple layers can likewise be used in accordance with examples of the present disclosure.

Turning now to more specific detail regarding the adhesive layer 116, as mentioned, this layer can comprise a blend of zinc oxide and tin oxide. The blend of zinc oxide and tin oxide can be applied at an atomic ratio of 20:1 to 1:20. In another example, the blend of zinc oxide and tin oxide can be applied at an atomic ratio of 10:1 to 1:5. In still another example, the zinc oxide to tin oxide atomic ratio can be about 2:1. When applied, the adhesive layer is typically at a thickness from 10 Å to 0.5 µm, and often, applied at a thickness ranging from 50 Å to 1000 Å. In one example, the blend of zinc oxide and tin oxide can substantially make up the entirety of the adhesive layer (essentially 100 wt % of the layer), but practically, a range from 90 wt % to 100 wt % can be typical. Furthermore, dopant(s) can be included in the layer, which include compounds such as Pb, Sb, Fe, Cu, Ca, In, Ga, Cd, Ge, Ti, etc. A dopant is defined as any material added to any layer ranging from 0.05 at % to less than 3 at % (atomic percent). Multiple dopants can be present, and thus, can exceed 3 at % cumulatively in some cases. With respect to the adhesive layer, the zinc oxide or the tin oxide are, by definition, not considered to be dopants. Thus, in the adhesive layer, any cation or other atom included that is other than zinc, tin, or oxygen, should be considered as a dopant.

In further detail regarding the adhesive layer, it is noted that the blend of zinc oxide and tin oxide can be amorphous when prepared under some conditions. As an amorphous compound, the adhesion blend promotes uniform mechanical performance, typically produces an atomically smooth interface, and provides acceptable barrier properties to lead and other impurities that may migrate into the adjacent electrode. Thus, the adhesive layer of the present disclosure provides reliable adhesion between many noble and other metallic materials, including platinum, copper, gold, ruthenium, and iridium, can be achieved. Furthermore, acceptable adhesion to non-metallic materials can also be achieved, making it a good adhesive to use between metallic and non-metallic layers or surfaces. As also mentioned, zinc oxide and tin oxide provide an acceptable diffusion barrier compared to titanium oxide. More specifically, even though titanium oxide works as an acceptable barrier in preventing lead from passing through the adhesive titanium oxide itself, it does not act sufficiently well to prevent migration of the lead into and through some metal electrodes, such as platinum. As lead reacts with titanium oxide to some degree to form lead titanate, even though the lead is stopped in the titanium oxide layer, it is still drawn through the metal electrode in order to contact the titanium oxide layer and react therewith. Specifically, with titanium oxide adhesion layers, a common lead content can be around 3 at % (or 1:10 ratio of Pb to Ti). Lead titanate ($PbTiO_3$) has a 1:1 atomic ratio, and thus, there is a lot of room for the attraction of lead by titanium oxide if the conditions are right, e.g., depending on the thickness, grain size/grain density of metal electrode layer, choice of metal, temperature and duration of anneal, etc. On the other hand, blends of zinc oxide and tin oxide do not have this same reactivity with lead, and thus, there is little to no migration into the metal electrode in the first place, as there are no reactive conditions awaiting the lead on the other side of the metal electrode. Thus, lead tends to stay out of the bulk of platinum layer altogether.

The blend of zinc oxide and tin oxide of the present disclosure also provides a reliable adhesion mechanism for adhering noble metals to non-metallic membranes, such as oxide substrates, while remaining thermally stable at higher temperature than many other adhesion layer materials. This, in combination with providing an improved lead diffusion barrier into the metal electrode, particularly when heated to high temperatures, provides a significant advantage over other adhesion systems. These and other properties promote a good combination of benefits provided by the blend of zinc oxide and tin oxide described herein. For example, with respect to platinum and other similar electrodes, there are thermophysical instabilities at temperatures in excess of 700° C. as a result of low wettability, leading to delamination. These defects often cause degraded performance and can result in inoperable devices.

Another advantage of the adhesive layer of the present disclosure is related to surface roughness, i.e. maintaining a relatively high level of smoothness. Generally, as processing temperatures are increased, the surface roughness can increase as well. However, with the adhesive layers of the present disclosure comprising blends of zinc oxide and tin oxide, the surface roughness, even with very high annealing temperatures, e.g. 1000° C. or more, can be low enough to still be effective for processing and use. For example, when annealed at 1000 C.° for one hour, a 6 nm RMS roughness was observed and an even lower roughness was observed when the material was annealed for a shorter time using Rapid Thermal Processing (RTP). This demonstrates the roughness suppression that is provided by this adhesive layer material. More specifically for comparison purposes, this surface roughness was similar to that observed for many sputter deposited metal films of similar thickness, which was unexpected. Thus, when attaching a substrate to a metal electrode, such as a silicon dioxide layer to a platinum electrode, surface smoothness that can be maintained over a wide variety of processing conditions can be useful.

As a final note with respect to FIG. 1, a passivation layer 124 is shown, and can be formed of any suitable material, including, but not limited to wet or dry process silicon dioxide, aluminum oxide (e.g., $Al_2O_3$), silicon carbide, silicon nitride, tetraethylorthosilicate-based oxides, borophosphosilicate glass, phosphosilicate glass, or borosilicate glass, $HfO_2$, $ZrO_2$, or the like. Suitable thicknesses for this layer can be from 10 nm to 1 µm, though thicknesses outside of this range can also be used.

With respect to the various layers described herein, any of a number of deposition methods or techniques can be used. For example, as mentioned, a PZT layer can be grown on or otherwise applied to the surface of a metal in some examples. Deposition techniques that can be used for depositing piezoelectric material or other layers on top of one another include sol-gel deposition, physical vapor deposition (PVD), pulsed laser deposition (PLD), atomic layer deposition (ALD), etc. Metal can be deposited, for example, by sputtering or other known deposition methods. Semiconductive, non-conductive, or passivation layers can be deposited by plasma enhanced chemical vapor deposition (PECVD), a low pressure chemical vapor deposition (LP-CVD), an atmosphere pressure chemical vapor deposition (APCVD), atomic layer deposition (ALD), sputter deposition, evaporation, thermal oxide deposition, or other known methods. Any combination of these or other methods can be used.

Figure 2:
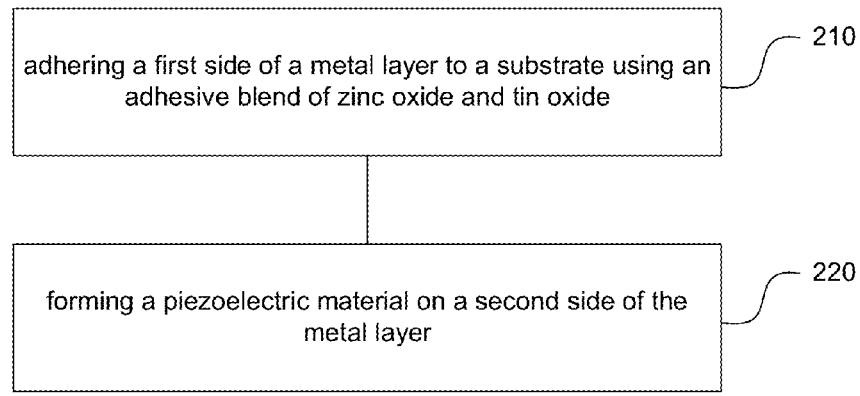
FIG. 2 is a schematic flow chart depicting a method in accordance with examples of the present disclosure.

Turning to FIG. 2, a method 200 of preparing a piezoelectric device can comprise adhering 210 a first side of a metal layer to a substrate using an adhesive blend of zinc oxide and tin oxide, and forming 220 a piezoelectric material on a second side of the metal layer. In one example, the piezoelectric material is PZT and is grown or otherwise applied on the first side of the metal layer. Normally, the adhesion layer goes on the substrate, and then the metal is applied to the adhesion layer (which is typically annealed prior to the metal deposition). The piezoelectric material, such as the PZT, can then be deposited layer by layer (if sol-gel is used) or the entire PZT film can be deposited in case of physical vapor deposition (PVD), pulsed laser deposition (PLD), or combinations thereof, for example. Other piezoelectric materials can likewise or alternatively be applied, as has been described previously.

EXAMPLES

The following examples illustrate the adhering and barrier properties of the present disclosure. However, it is to be understood that the following are only exemplary or illustrative of the application of the principles of the present devices and methods. Numerous modifications and alternative devices and methods may be devised by those skilled in the art without departing from the spirit and scope of the present compositions and methods. The appended claims are intended to cover such modifications and arrangements. Thus, while the present examples have been described above with particularity, the following provides further detail in connection with what are presently deemed to be the acceptable embodiments.

Example 1

Figure 3:
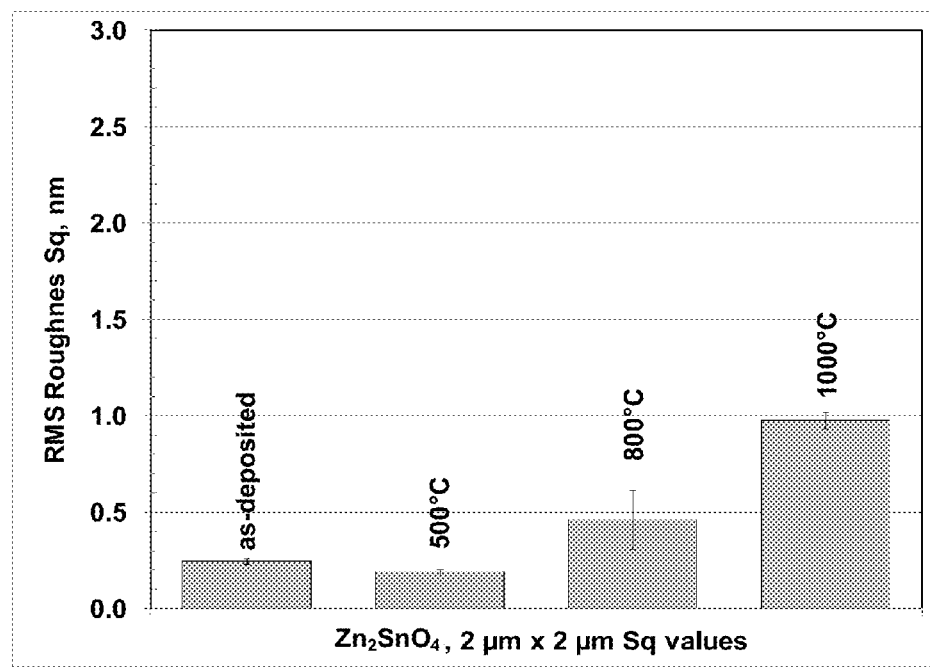
FIG. 3 is a graph depicting surface roughness of a blended adhesive layer of zinc oxide and tin oxide as a function of annealing temperature.

A 2:1 atomic ratio blend of zinc oxide and tin oxide (ZTO, $Zn_2SnO_4$) adhesive was prepared and investigated with thin films of $SiO_2$. The purpose of this study was to demonstrate the inherent thermal stability of the blends of zinc oxide and tin oxide in thin film stacks of the present disclosure. The structure was subjected to annealing temperatures up to 1000° C. in a furnace and in an RTP (rapid thermal annealing) tool with rates of heating of 10° C./min and 50° C./sec, respectively. Duration was 1 hour in a furnace and 10 min in RTP. The surface roughness was evaluated using Atomic Force Microscopy (AFM), and characterized as Root Mean Square (RMS) Roughness, nm. As can be seen in FIG. 3, the surface roughness of the ZTO after a 1000° C. Rapid Thermal Anneal is below 1 nm. A 100 nm Platinum layer deposited on the annealed ZTO layer began to increase at some temperature higher than 500° C., demonstrating the thermal stability of such structures.

Example 2

For comparison purposes in determining lead diffusion or migration through a thin metal electrode, two similar structures were prepared, the only difference being the choice of adhesive layer. Specifically, both structures included platinum electrode adhered to a silicon dioxide layer with the adhesive layer applied there between. To the platinum electrode was also deposited a layer of PZT (opposite the silicon dioxide layer). This material stack was exposed to thermal processing in excess of 600° C. during the PZT processing steps. The final thickness of the PZT ($PbZr_{0.52}Ti_{0.48}O_3$) was around 1 micron. In the first structure, the adhesive layer was a 50 nm thick blend of zinc oxide and tin oxide (ZTO, 2:1 atomic ratio based on the ratio of Zn to Sn cations, e.g., $Zn_2SnO_4$). In the second structure, around 20 nm of a titanium oxide was used as the adhesive.

Next, it was determined how much lead cation each structure permitted to pass through the platinum electrode into the adhesive layer, as observed by XPS analysis. For this analysis, the samples were used after selective PZT etching, analyzing only platinum electrodes applied to substrates with the adhesion layer applied there between. In case of the titanium oxide adhesion layer, lead was detected in quantities of at least 3 at %, which corresponds to 10:1 ratio between Ti and Pb or $Pb_{0.1}TiO_{2.1}$. Lead was not detectable below the PZT with the XPS analysis device in either the platinum or the ZTO adhesion layer.

While the disclosure has been described with reference to certain embodiments, those skilled in the art will appreciate that various modifications, changes, omissions, and substitutions can be made without departing from the spirit of the disclosure. It is intended, therefore, that the present disclosure be limited only by the scope of the following claims.

What is claimed is:

1. A thin film stack, comprising a substrate, a metal layer, and an adhesive layer, wherein the adhesive layer comprises a blend of zinc oxide and tin oxide, wherein the adhesive layer is adhered to the substrate and the metal layer, and wherein the blend of zinc oxide and tin oxide comprises from 90 at % to 100 at % of the adhesive layer, and is present at a zinc oxide to tin oxide atomic ratio of 1:20 to 20:1.

2. The thin film stack of claim 1, wherein the thin film stack further comprises a piezoelectric layer.

3. The thin film stack of claim 2, wherein the piezoelectric layer is PZT.

4. The thin film stack of claim 2, wherein the thin film stack is an actuator for fluid ejection device.

5. The thin film stack of claim 1, wherein the substrate comprise a membrane from 10 Å to 10 µm in thickness, and the membrane is selected from nitrides, carbides, oxides, or metals.

6. The thin film stack of claim 1, wherein the metal layer is a metal electrode from 5 nm to 5 microns in thickness, and is selected from platinum, silver, iridium, palladium, or alloys thereof.

7. The thin film stack of claim 1, wherein the adhesive layer is from 10 Å to 0.5 µm in thickness.

8. The thin film stack of claim 1, wherein the adhesive layer, in addition to the blend, comprises from 0.05 at % to less than 3 at % of at least one dopant.

9. The thin film stack of claim 1, wherein the adhesive layer provides adhesion between the substrate and the metal layer up to at least 1000° C. without delamination.

10. A thin film stack, comprising a substrate, a metal layer, and an adhesive layer, wherein the adhesive layer comprises a blend of zinc oxide and tin oxide, wherein the adhesive layer is adhered to the substrate and the metal layer, and wherein the adhesive layer, in addition to the blend, comprises from 0.05 at % to less than 3 at % of at least one dopant.

11. The thin film stack of claim 10, wherein the thin film stack further comprises a piezoelectric layer.

12. The thin film stack of claim 11, wherein the piezoelectric layer is PZT.

13. The thin film stack of claim 11, wherein the thin film stack is an actuator for fluid ejection device.

14. The thin film stack of claim 10, wherein the substrate comprise a membrane from 10 Å to 10 µm in thickness, and the membrane is selected from nitrides, carbides, oxides, or metals.

15. The thin film stack of claim 10, wherein the metal layer is a metal electrode from 5 nm to 5 microns in thickness, and is selected from platinum, silver, iridium, palladium, or alloys thereof.

16. The thin film stack of claim 10, wherein the adhesive layer is from 10 Å to 0.5 µm in thickness.

17. The thin film stack of claim 10, wherein the adhesive layer provides adhesion between the substrate and the metal layer up to at least 1000° C. without delamination.

18. A thin film stack, comprising a substrate, a metal layer, and an adhesive layer, wherein the adhesive layer comprises a blend of zinc oxide and tin oxide, and wherein the adhesive layer is adhered between the substrate and the metal layer, and wherein the thin film stack further comprises a piezoelectric layer.

19. The thin film stack of claim 18, wherein the piezoelectric layer is attached directly to an opposing surface of the metal layer with respect to the adhesive layer, the metal layer is a metal electrode, and the thin film stack further comprises a second metal electrode positioned on the piezoelectric layer such that when the metal electrode and the second metal electrode are used to generate an electrical potential, the piezoelectric layer acts as a piezoelectric actuator.

20. The thin film stack of claim 18, wherein the piezoelectric layer is PZT.

21. The thin film stack of claim 18, wherein the thin film stack is an actuator for fluid ejection device.

22. The thin film stack of claim 18, wherein the substrate comprise a membrane from 10 Å to 10 µm in thickness, and the membrane is selected from nitrides, carbides, oxides, or metals.

23. The thin film stack of claim 18, wherein the metal layer is a metal electrode from 5 nm to 5 microns in thickness, and is selected from platinum, silver, iridium, palladium, or alloys thereof.

24. The thin film stack of claim 18, wherein the blend of zinc oxide and tin oxide comprises from 90 at % to 100 at % of the adhesive layer, and is present at a zinc oxide to tin oxide atomic ratio of 1:20 to 20:1.

25. The thin film stack of claim 18, wherein the adhesive layer is from 10 Å to 0.5 µm in thickness.

26. The thin film stack of claim 18, wherein the adhesive layer, in addition to the blend, comprises from 0.05 at % to less than 3 at % of at least one dopant.

27. The thin film stack of claim 18, wherein the adhesive layer provides adhesion between the substrate and the metal layer up to at least 1000° C. without delamination.

* * * * *